(12) United States Patent
Vickers et al.

(10) Patent No.: US 10,333,500 B1
(45) Date of Patent: Jun. 25, 2019

(54) SELF-GATING PULSED FLIP-FLOP

(71) Applicant: Advanced Micro Devices, Inc., Santa Clara, CA (US)

(72) Inventors: David Scott Vickers, Ft. Collins, CO (US); Patrick J. Shyvers, Ft. Collins, CO (US)

(73) Assignee: Advanced Micro Devices, Inc., Santa Clara, CA (US)

( * ) Notice: Subject to any disclaimer, the term of this patent is extended or adjusted under 35 U.S.C. 154(b) by 0 days.

(21) Appl. No.: 15/883,650

(22) Filed: Jan. 30, 2018

(51) Int. Cl.
| H03K 3/037 | (2006.01) |
| H03K 5/135 | (2006.01) |
| G11C 11/41 | (2006.01) |
| H03K 19/177 | (2006.01) |
| H03K 19/00 | (2006.01) |
| H03K 19/096 | (2006.01) |
| H03K 3/57 | (2006.01) |

(52) U.S. Cl.
CPC ............ *H03K 3/0372* (2013.01); *G11C 11/41* (2013.01); *H03K 3/57* (2013.01); *H03K 5/135* (2013.01); *H03K 19/0016* (2013.01); *H03K 19/0966* (2013.01); *H03K 19/17744* (2013.01)

(58) Field of Classification Search
CPC ..................................................... H03K 3/0372
See application file for complete search history.

(56) References Cited

U.S. PATENT DOCUMENTS

| 7,154,319 | B2 | 12/2006 | Kim |
| 7,737,757 | B2 | 6/2010 | Behrends et al. |
| 7,772,906 | B2 | 8/2010 | Naffziger |
| 8,643,411 | B1 | 2/2014 | Goyal et al. |
| 9,270,270 | B2 | 2/2016 | Cai et al. |
| 2015/0200651 | A1 | 7/2015 | Baratam |
| 2016/0049937 | A1* | 2/2016 | Tong ............... H03K 19/0016 327/199 |
| 2017/0353186 | A1 | 12/2017 | Ye et al. |

OTHER PUBLICATIONS

Stojanovic, V. and Oklobdzija, V., "Lecture 8: Latch and Flip Flop Design," Computer Systems Laboratory, Stanford University, EE371, Apr. 24, 2002, 34 pages.

* cited by examiner

*Primary Examiner* — Daniel C Puentes
(74) *Attorney, Agent, or Firm* — Zagorin Cave LLP

(57) ABSTRACT

A circuit includes a latch configured to update a stored state of the latch in response to an input data signal and a pulsed clock signal. The circuit includes a pulse generator configured to generate the pulsed clock signal based on an input clock signal, the input data signal, and a feedback signal indicative of a stored state of the latch. The pulse generator may be configured to generate a pulse enable signal based on the input data signal, the input clock signal, and the feedback signal. The pulsed clock signal may be based on the pulse enable signal and the input clock signal. The pulse generator may generate the pulsed clock signal to have a pulse of a first signal level in response to an indication that the stored state of the latch needs to change and generates the pulsed clock signal to have a second signal level, otherwise.

13 Claims, 4 Drawing Sheets

SELF-GATING PULSED FLIP-FLOP

BACKGROUND

Description of the Related Art

In general, synchronous circuits use flip-flops or latches to store data in integrated circuits. Referring to FIG. 1, a conventional master-slave flip-flop includes master latch 102 coupled in series with slave latch 104, each of which may include a gated D latch. Slave latch 104 changes state in response to a change in the state of master latch 102. When clock signal CLK has a first logic level (e.g., a high value, i.e., CLK=='1'), master latch 102 stores input data D, but slave latch 104 is unable to change state. When clock signal CLK has a second logic level (e.g., a low value, i.e., CLK=='0'), slave latch 104 stores the output level of master latch 102, and master latch 104 cannot change state. As a result, output Q of master-slave flip-flop 100 changes state only when clock signal CLK makes a transition from the first logic level to the second logic level. Master-slave flip-flop 100 consumes dynamic power due to the clock signal charging and discharging capacitances in master latch 102 and slave latch 104.

Referring to FIG. 2, pulsed latch 200 includes pulse generator 202, which generates pulsed clock signal CLK-PULSE based on clock signal CLK. Pulse generator 202 may include an AND gate responsive to clock signal CLK and an inverted version of clock signal CLK, although other circuit implementations may be used. When clock signal CLK has a first logic level (e.g., a low value), control signal PULSEENABLE has a second logic level (e.g., a high value) and pulsed clock signal CLKPULSE has the first logic level. When clock signal CLK rises, control signal PULSEENABLE still has the second logic level until inverter 206 changes the logic level of control signal PULSEENABLE to the first logic level (e.g., a low value). During this time, pulsed clock signal CLKPULSE quickly changes logic levels (e.g., rises). As soon as control signal PULSEENABLE changes levels (e.g., falls), pulsed clock signal CLKPULSE changes logic levels again (e.g., falls). Latch 204 captures input data D during the active pulse width of pulsed clock signal CLKPULSE. Pulsed latch 200 consumes dynamic power in the pulse generator and due to the pulsed clock signal charging and discharging capacitances in 204. Pulsed latch 200 has no mechanism to guarantee capture of input data D before the fall of pulsed clock signal CLKPULSE. Manufacturing process variations can widen or narrow the pulse width of pulsed clock signal CLKPULSE, which may result in a large hold time penalty or a write failure, respectively.

Clock signals that charge and discharge capacitances to control conventional flip-flops or conventional pulsed latches dissipate substantial amounts of dynamic power. Clock gating is a technique used in synchronous circuits for reducing that dynamic power dissipation. The technique saves power by including additional circuitry to prevent propagation of a clock signal through individual blocks when those blocks are inactive, effectively disabling the functionality of those blocks. Since large blocks of logic may not switch for many cycles, clock gating techniques may save substantial amounts of dynamic power. Typically, the additional circuitry uses register enable conditions to control propagation of clock signals. However, clock gating techniques are most effective when large numbers of flip-flops can be grouped to be responsive to a shared register enable signal and an associated event can be anticipated. Satisfaction of both of those requirements may be infeasible in some portions of a design. As advances in total design power continue, reduction of power in those portions of a design becomes more critical. Accordingly, improved techniques for controlling storage elements in synchronous circuits are desired.

SUMMARY OF EMBODIMENTS OF THE INVENTION

In at least one embodiment, a circuit includes a latch configured to update a stored state of the latch in response to an input data signal and a pulsed clock signal. The circuit includes a pulse generator configured to generate the pulsed clock signal based on an input clock signal, the input data signal, and a feedback signal indicative of a stored state of the latch. The pulse generator may be configured to generate a pulse enable signal based on the input data signal, the input clock signal, and the feedback signal. The pulsed clock signal may be based on the pulse enable signal and the input clock signal. The pulse generator may include a comparator to generate a reset signal based on the input data signal and the feedback signal. The pulse enable signal may be based on the reset signal. The pulse generator may include a set-reset latch configured to generate the pulse enable signal based on a set signal and the reset signal.

In at least one embodiment, a method includes updating a stored state of a latch to correspond to a state of an input data signal in response to a pulse of a pulsed clock signal. The method includes enabling the pulse in response to a clock signal having a first level and the stored state corresponding to a first logic level of a prior input data signal different from a second logic level of the input data signal. The method includes disabling the pulse in response to the clock signal having a second level. The method includes generating the pulsed clock signal to have a fixed signal level in response to the stored state corresponding to a prior input data signal having the same logic level as the input data signal.

In at least one embodiment, a circuit includes a latch configured to update a stored state of the master latch to store a state of an input data signal in response to a first signal level of a pulsed clock signal. The circuit includes a pulse generator circuit configured to generate the pulsed clock signal to have a pulse of the first signal level in response to an indication that the stored state of the latch needs to change and generates the pulsed clock signal to have a second signal level otherwise. The pulse generator circuit may include a comparator circuit responsive to a feedback signal from the latch and the input data signal and a set-reset latch coupled in series with the comparator circuit.

BRIEF DESCRIPTION OF THE DRAWINGS

The present invention may be better understood, and its numerous objects, features, and advantages made apparent to those skilled in the art by referencing the accompanying drawings.

The use of the same reference symbols in different drawings indicates similar or identical items.

DETAILED DESCRIPTION

Figure 3:
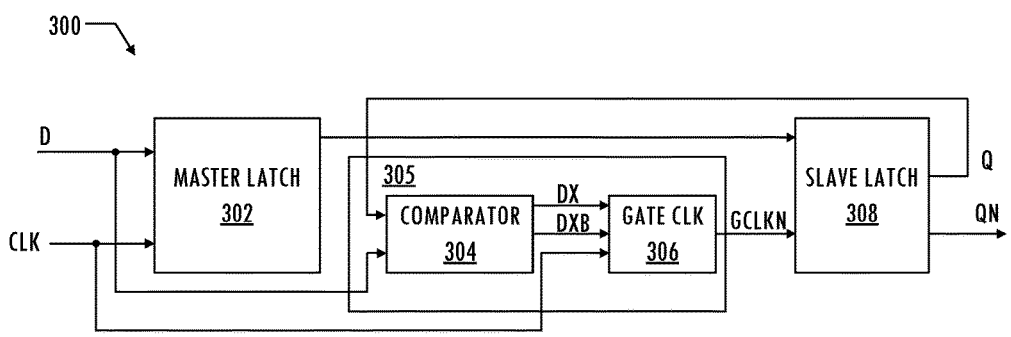
FIG. 3 illustrates a functional block diagram of a self-gating master-slave flip-flop.
Figure 4:
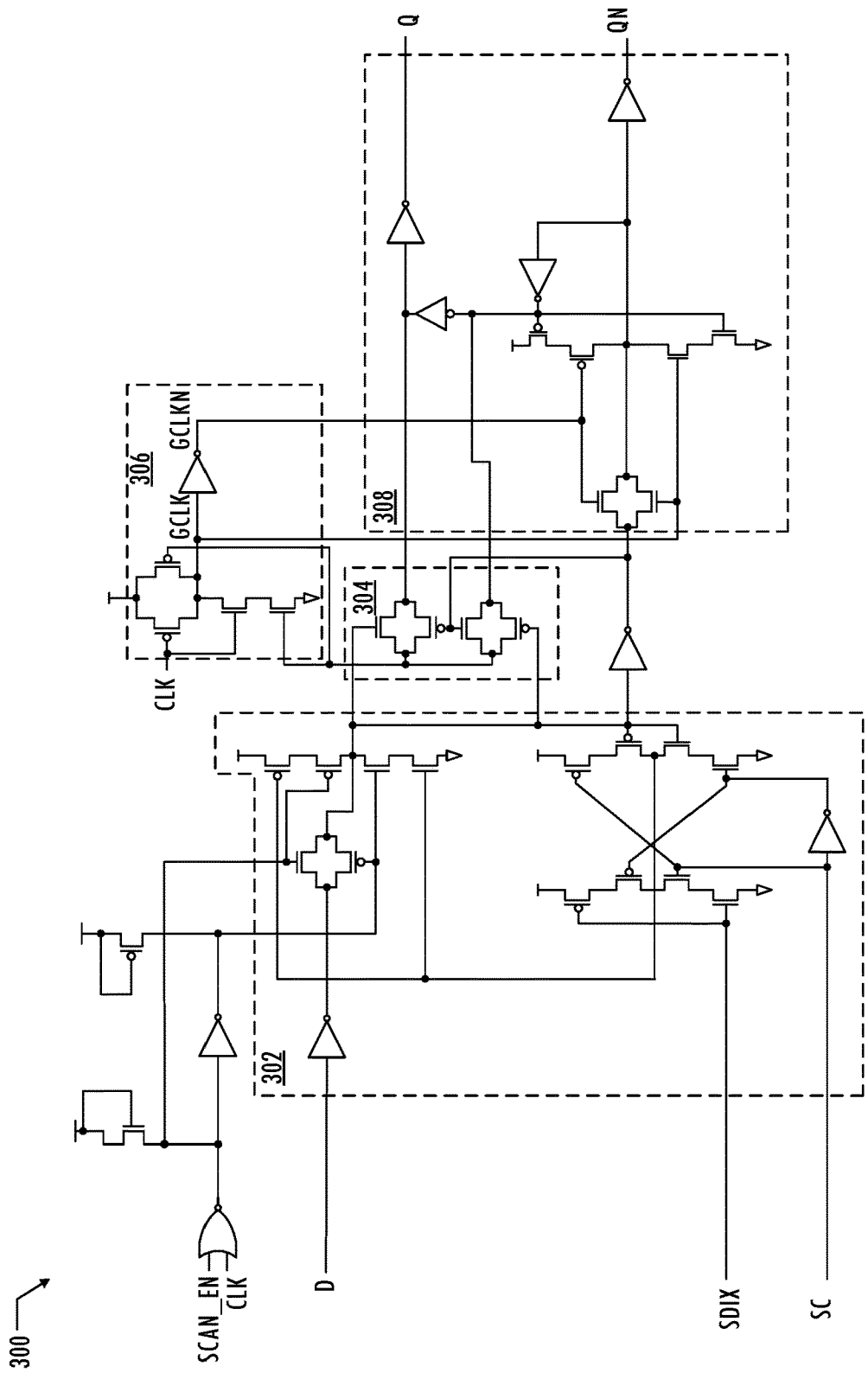
FIG. 4 illustrates an exemplary circuit diagram of the self-gating master-slave flip-flop of FIG. 3.

A technique for reducing power consumption in synchronous circuits gates a clock signal to prevent propagation of the clock signal to a slave latch of a master-slave flip-flop when no state update is needed. Referring to FIGS. 3 and 4, self-gating flip-flop 300 includes master latch 302 coupled in series with slave latch 308. Master latch 302 receives clock signal CLK, which may be externally gated. Self-gating flip-flop 300 includes clock gating circuit 305 that provides gated clock signal GCLKN to slave latch 308 based on clock signal CLK and a comparison of an indicator of the state stored by slave latch 308 and a version of input data signal D. Clock gating circuit 305 includes comparator 304, which generates at least one signal (e.g., DX and DXB) indicative of the comparison of the indicator of the state stored by slave latch 308 to the version of input data signal D. Gate clock circuit 306 is a logic circuit (e.g., a NAND logic circuit) that uses the signal(s) indicative of the comparison to control propagation of clock signal CLK and generate gated clock signal GCLKN based on clock signal CLK. Although clock gating circuit 305 disables gated clock signal GCLKN provided to slave latch 308 if there is no change to input data signal D and slave latch 308 does not need a state update, master latch 302 continues to receive full clock power.

Figure 5:
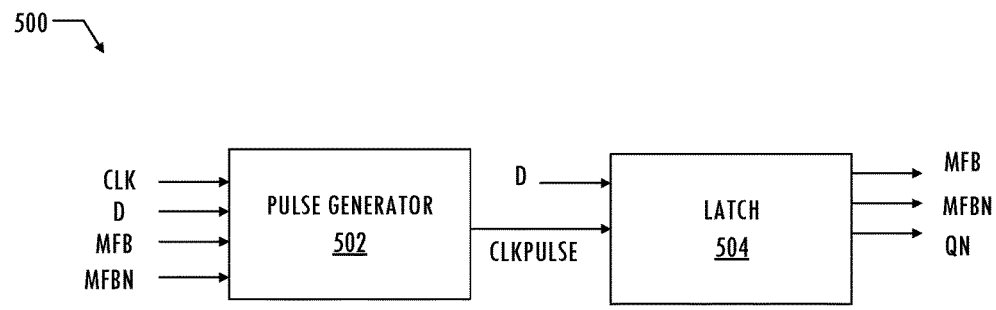
FIG. 5 illustrates a functional block diagram of a self-gating pulsed flip-flop consistent with at least one embodiment of the invention.
Figure 6:
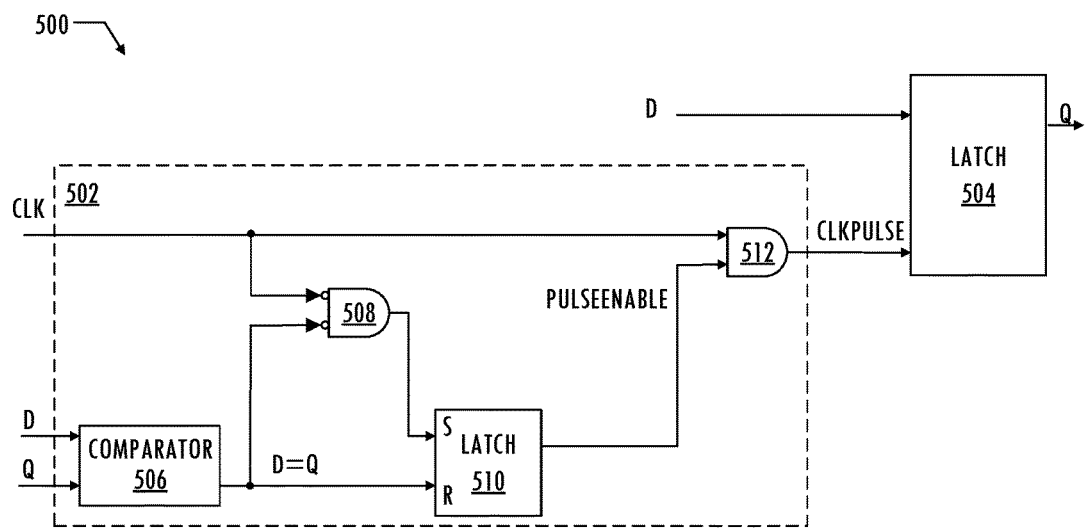
FIG. 6 illustrates a detailed functional block diagram of the self-gating pulsed flip-flop of FIG. 5 consistent with at least one embodiment of the invention.
Figure 7:
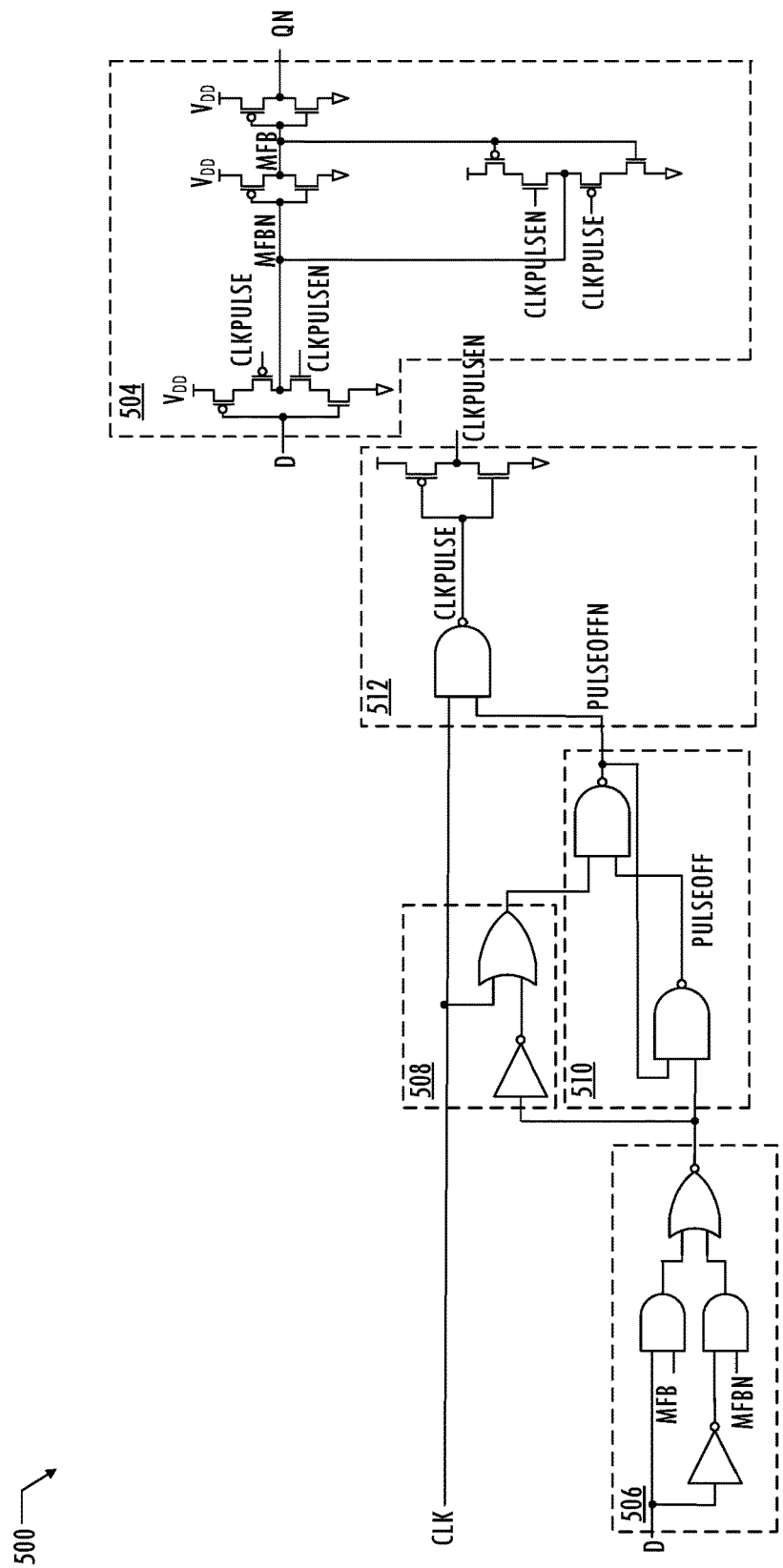
FIG. 7 illustrates a circuit diagram of the self-gating pulsed flip-flop of FIG. 5 consistent with at least one embodiment of the invention.

Referring to FIGS. 5-7, self-gating pulsed flip-flop 500 prevents propagation of a clock signal to all latches of self-gating pulsed flip-flop 500 when no state update is needed, thereby reducing dynamic power dissipation as compared to master-slave flip-flop 100, pulsed latch 200, and self-gating flip-flop 300. Latch 504 stores a current state of input data D as stored state Q. Latch 504 updates stored state Q in response to pulsed clock signal CLKPULSE, which is a pulse of clock signal CLK. Pulse generator 502 generates pulsed clock signal CLKPULSE based on clock signal CLK, input data D, and at least one feedback signal indicating stored state Q of latch 504. Latch 504 provides at least one feedback signal (e.g., feedback signal MFB and feedback signal MFBN) indicative of stored state Q. Note that rather than provide feedback signal MFB and feedback signal MFBN, latch 504 may provide Q, QN, and/or other versions of stored state Q of latch 504 as feedback signals to pulse generator 502.

In at least one embodiment, comparator 506 compares input data signal D to the feedback signal(s) indicative of stored state Q of latch 504 (e.g., one or more versions of Q, QB, MFB or MFBN) to generate a signal indicating whether the input data signal has changed logic levels (e.g., input signal D and stored state Q have different logic levels) and the stored state Q of latch 504 needs to change. When input signal D and a prior input signal D corresponding to stored state Q have different logic levels and clock signal CLK has a first logic level (e.g. clock signal CLK is low), signal PULSEENABLE has a logic level (e.g., signal PULSEENABLE is high) that causes pulse generator 502 to enable a pulse of pulsed clock signal CLKPULSE that enables latch 504 to sample input data signal D. Latch 504 updates stored state Q (e.g., stored state Q receives a next state) and the corresponding output signal. In response to clock signal CLK having a second logic level (e.g., clock signal CLK is high) and input signal D and a prior input signal D corresponding to stored state Q have different logic levels, signal PULSEENABLE transitions to an inactive level (e.g., signal PULSEENABLE is low), disabling a pulse of pulsed clock signal CLKPULSE. In response to input signal D and a prior input signal D corresponding to stored state Q have the same logic level, PULSEENABLE has an inactive level and pulsed clock signal CLKPULSE has a fixed signal level.

In at least one embodiment, pulse generator 502 includes logic circuit 512 (e.g., an AND gate) responsive to clock signal CLK and an output of latch 510. In at least one embodiment, latch 510 is a set-reset latch (i.e., an SR latch) which may be implemented using cross-coupled NAND gates. Latch 510 sets signal PULSEENABLE responsive to the output logic circuit 508, which indicates when clock signal CLK has a low logic level and input data D has a logic level different from a logic level of prior input data D corresponding to stored state Q, as indicated by the output of comparator 506. Latch 510 resets in response to input data D having a logic level the same as the logic level of prior input data D corresponding to stored state Q, thereby causing logic circuit 512 to cease passing clock signal CLK as pulsed clock signal CLKPULSE, ending the pulse of pulsed clock signal CLKPULSE and closing latch 504. Latch 504 does not sample any other value of input data D until the next rising edge of pulsed clock signal CLKPULSE, which occurs only when stored state Q needs to be updated.

In at least one embodiment, self-gating pulsed flip-flop 500 implements the functionality of Table 1, below. Note that other embodiments of self-gating pulsed flip-flop implement complementary versions of Table 1 or use different combinations of logic gates in output logic circuit 508 and logic circuit 512 consistent with Table 1. In addition, customized transistor circuits may be used to combine logic states that implement the functionality of Table 1. For example, NOR gate 508 and a NAND gate in latch 510 may be combined to use a single AND-OR-Invert gate that uses fewer transistors than the implementation illustrated in FIG. 6.

TABLE 1

| Self-gating Pulsed Flop State Transition Table | | | | |
|---|---|---|---|---|
| D | Q | CLK | Q (next) | PULSEENABLE |
| 0 | 0 | 0 | 0 | 0 |
| 0 | 0 | 1 | 0 | 0 |
| 0 | 1 | 0 | 1 | 1 |
| 0 | 1 | 1 | 0 | 1 → 0 |
| 1 | 0 | 0 | 0 | 1 |
| 1 | 0 | 1 | 1 | 1 → 0 |
| 1 | 1 | 0 | 1 | 0 |
| 1 | 1 | 1 | 1 | 0 |

In at least one embodiment, self-gating pulsed flip-flop 500 is used in circuits that change state infrequently (e.g., a last-level cache of a memory system). Those circuits consume less dynamic power than corresponding circuits using master-slave flip-flop 100, pulsed latch 200, or self-gating flip-flop 300, when state changes are required in less than 33% of cycles of clock signal CLK. In at least one embodiment, self-gating pulsed flip-flop 500 has a smaller design that uses fewer transistors than self-gating flip-flop 300.

Figure 1:
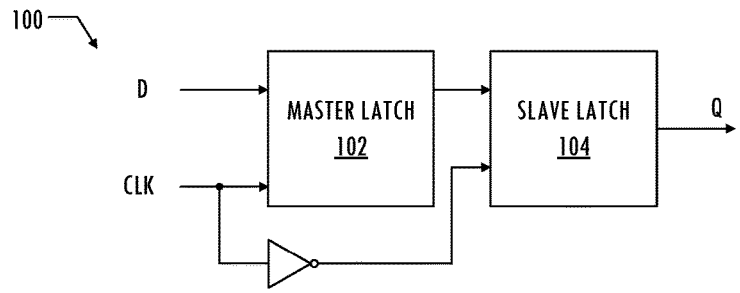
FIG. 1 illustrates a functional block diagram of a conventional master-slave flip-flop.
Figure 2:
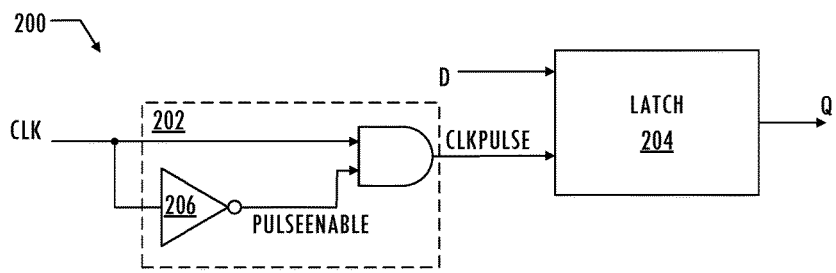
FIG. 2 illustrates a functional block diagram of a conventional pulse-triggered latch.

Since self-gating pulsed flip-flop 500 uses an output state change to trigger the fall of the pulse, self-gating pulsed flip-flop 500 reduces or eliminates hold time penalties and write failures caused by changes to the pulse width of a pulsed clock signal due to manufacturing process variations, as described above with respect to pulsed latch 200 of FIG. 2.

Thus, a self-gating pulsed flip-flop that consumes less dynamic power and has a smaller size than other state elements has been described. While circuits and physical structures have been generally presumed in describing embodiments of the invention, it is well recognized that in modern semiconductor design and fabrication, physical structures and circuits may be embodied in computer-readable descriptive form suitable for use in subsequent design, simulation, test or fabrication stages. Structures and functionality presented as discrete components in the exemplary configurations may be implemented as a combined structure or component. Various embodiments of the invention are contemplated to include circuits, systems of circuits, related methods, and tangible computer-readable medium having encodings thereon (e.g., VHSIC Hardware Description Language (VHDL), Verilog, GDSII data, Electronic Design Interchange Format (EDIF), and/or Gerber file) of such circuits, systems, and methods, all as described herein, and as defined in the appended claims.

The description of the invention set forth herein is illustrative, and is not intended to limit the scope of the invention as set forth in the following claims. For example, while the invention has been described in an embodiment in which active high signals and CMOS circuits are used, one of skill in the art will appreciate that the teachings herein can be utilized with active low signals and/or other integrated circuit technologies. In addition, other functionally equivalent logic circuits may be used to implement output logic circuit 508, logic circuit 512, comparator 506, and latch 510. Variations and modifications of the embodiments disclosed herein, may be made based on the description set forth herein, without departing from the scope of the invention as set forth in the following claims.

What is claimed is:

1. A circuit comprising:
   a latch configured to update a stored state of the latch in response to an input data signal and a pulsed clock signal; and
   a pulse generator configured to generate the pulsed clock signal based on an input clock signal, the input data signal, and a feedback signal indicative of the stored state of the latch,
   wherein the pulse generator is configured to generate a pulse enable signal based on the input data signal, the input clock signal, and the feedback signal, the pulsed clock signal being based on the pulse enable signal and the input clock signal, and
   wherein the pulse generator comprises:
      a comparator configured to generate a reset signal based on the input data signal and the feedback signal, the pulse enable signal being based on the reset signal; and
      a set-reset latch configured to generate the pulse enable signal based on a set signal and the reset signal.

2. The circuit, as recited in claim 1, wherein the pulse generator further comprises:
   a first logic circuit configured to combine the reset signal and the input clock signal to generate the set signal.

3. The circuit, as recited in claim 2, wherein the first logic circuit generates the set signal to have a first logic level in response to the input clock signal and the reset signal having the first logic level and the first logic circuit generates the set signal to have a second logic level in response to at least one of the input clock signal and the reset signal having the second logic level.

4. The circuit, as recited in claim 2, wherein the first logic circuit generates the set signal to have a first logic level in response to the reset signal having a second logic level and the input clock signal having the second logic level.

5. The circuit, as recited in claim 2, wherein the pulse generator further comprises:
   a second logic circuit configured to combine the pulse enable signal and the input clock signal to generate the pulsed clock signal.

6. The circuit, as recited in claim 5, wherein the second logic circuit asserts the pulsed clock signal in response to the pulse enable signal having a first logic level and the input clock signal having the first logic level.

7. The circuit, as recited in claim 5, wherein the pulsed clock signal is cleared by the second logic circuit in response to the reset signal being set.

8. The circuit, as recited in claim 1, wherein the latch samples the input data signal on a rising edge of the input clock signal.

9. The circuit, as recited in claim 1, wherein the pulse generator generates the pulsed clock signal to have a pulse of a first signal level in response to an indication that the stored state of the latch needs to change and generates the pulsed clock signal to have a second signal level otherwise.

10. A method comprising:
    updating a stored state of a latch to correspond to a state of an input data signal in response to a pulse of a pulsed clock signal;
    enabling the pulse in response to a clock signal having a first level and the stored state corresponding to a first logic level of a prior input data signal different from a second logic level of the input data signal, wherein the enabling comprises:
       asserting a pulse enable signal in response to the clock signal having the first level and the stored state corresponding to the first logic level of the prior input data signal different from the second logic level of the input data signal;
       generating a comparison signal based on a comparison of the input data signal and an indicator of the prior input data signal;
       generating a set signal based on the clock signal and the comparison signal; and
       providing a reset signal based on the comparison signal;
    disabling the pulse in response to the clock signal having a second level; and
    generating the pulsed clock signal to have a fixed signal level in response to the stored state corresponding to a prior input data signal having the same logic level as the input data signal.

11. The method, as recited in claim 10, wherein the asserting comprises:
    setting and resetting a second latch based on the set signal and the reset signal to generate the pulse enable signal.

12. The method, as recited in claim 11, wherein propagation of the clock signal to the second latch is blocked in response to the input data signal and the prior input data signal having the same signal level.

13. A circuit comprising:
- a latch configured to update a stored state of the latch to store a state of an input data signal in response to a first signal level of a pulsed clock signal; and
- a pulse generator circuit configured to generate the pulsed clock signal to have a pulse of the first signal level in response to an indication that the stored state of the latch needs to change and generates the pulsed clock signal to have a second signal level otherwise,
- wherein the pulse generator circuit comprises:
  - a comparator circuit responsive to a feedback signal from the latch and the input data signal; and
  - a set-reset latch coupled in series with the comparator circuit.

\* \* \* \* \*